(12) United States Patent
Xu

(10) Patent No.: US 6,764,890 B1
(45) Date of Patent: Jul. 20, 2004

(54) METHOD OF ADJUSTING THE THRESHOLD VOLTAGE OF A MOSFET

(75) Inventor: Yanzhong Xu, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/353,553

(22) Filed: Jan. 29, 2003

(51) Int. Cl.$^7$ .......................................... H01L 21/8238
(52) U.S. Cl. ...................... 438/199; 438/369; 438/506; 438/527
(58) Field of Search .................. 438/199, 217, 438/369, 370, 373, 506, 519, 527, 659, FOR 442

(56) References Cited

U.S. PATENT DOCUMENTS

| | | | |
|---|---|---|---|
| 4,411,058 A | * 10/1983 | Chen | ........................ 438/218 |
| 5,182,225 A | * 1/1993 | Matthews | |
| 5,316,963 A | * 5/1994 | Kojima | ........................ 438/200 |
| 5,493,251 A | 2/1996 | Khambaty et al. | |
| 5,726,477 A | * 3/1998 | Williams et al. | ............ 257/402 |
| 5,756,365 A | * 5/1998 | Kakumu | ..................... 438/304 |
| 5,763,922 A | * 6/1998 | Chau | .......................... 257/371 |
| 5,814,544 A | * 9/1998 | Huang | ........................ 438/291 |
| 6,081,011 A | * 6/2000 | Bae | ............................ 257/345 |
| 6,121,664 A | * 9/2000 | Aoki | |
| 6,156,591 A | * 12/2000 | Wu | ............................. 438/199 |
| 6,180,969 B1 | 1/2001 | Yang et al. | |
| 6,184,055 B1 | 2/2001 | Yang et al. | |
| 6,251,718 B1 | * 6/2001 | Akamatsu et al. | |
| 6,281,140 B1 | * 8/2001 | Chen et al. | ................. 438/763 |
| 6,417,550 B1 | 7/2002 | Madurawe et al. | |
| 6,441,412 B2 | 8/2002 | Oh et al. | |
| 6,448,121 B1 | 9/2002 | Brighton | |
| 6,565,762 B1 | * 5/2003 | Silverbrook | ................. 216/27 |

OTHER PUBLICATIONS

Chapman et al. "High Performace Sub–Half Micron CMOS Using Rapid Thermal Processing" 1991, Dallas, Tx, USA, pp. 101–104.*

* cited by examiner

*Primary Examiner*—George Fourson
*Assistant Examiner*—Fernando L. Toledo
(74) *Attorney, Agent, or Firm*—Okamoto & Benedicto LLP

(57) ABSTRACT

In one embodiment, the threshold voltage of a first transistor is adjusted by implanting a dopant through a mask (e.g., photoresist material). The thickness of the mask may be varied to obtain a particular threshold voltage. The mask may be formed such that it covers a first transistor region where the first transistor is to be fabricated, while leaving a second transistor region exposed. This allows an implant step to adjust the threshold voltage of the first transistor and to form a well in the second transistor region.

15 Claims, 2 Drawing Sheets

METHOD OF ADJUSTING THE THRESHOLD VOLTAGE OF A MOSFET

BACKGROUND OF THE INVENTION

1. Field of the Invention

The present invention relates generally to integrated circuits, and more particularly to integrated circuit fabrication processes and structures.

2. Description of the Background Art

As is well known, a metal oxide semiconductor field effect transistor (MOSFET) includes a source, a drain, and a gate. The source and the drain are typically formed in a substrate, and separated by a channel. In an enhancement-type MOSFET, a channel sufficient to allow current flow between the source and the drain is not formed until the voltage on the gate relative to the source ($v_{gs}$) equals or exceeds the threshold voltage ($V_T$) of the MOSFET.

Complementary metal semiconductor technology (CMOS) allows fabrication and use of two kinds of enhancement-type MOSFET's in the same substrate. The first kind has a P-type channel and is referred to as a "PMOS transistor", while the second kind has an N-type channel and is referred to as an "NMOS transistor". PMOS and NMOS transistors may be fabricated in a P-type substrate. In that case, an N-well implant is performed to form an N-well in the region where the PMOS transistor is to be fabricated. The region where the NMOS transistor is to be fabricated is blocked during the N-well implant.

Transistors whose channel is to be formed in a substrate are referred to as "native transistors", while those whose channel is to be formed in a well are referred to as "well transistors". In the case where a P-type substrate is employed, the NMOS transistor is the native transistor and the PMOS transistor is the well transistor. To adjust the threshold voltage of a native NMOS transistor, a compensate implant step may be performed after the N-well implant. However, a compensate implant step increases manufacturing costs because it is an additional implant step and requires additional masking steps.

SUMMARY

In one embodiment, the threshold voltage of a first transistor is adjusted by implanting a dopant through a mask (e.g., photoresist material). The thickness of the mask may be varied to obtain a particular threshold voltage. The mask may be formed such that it covers a first transistor region where the first transistor is to be fabricated, while leaving a second transistor region exposed. This allows an implant step to adjust the threshold voltage of the first transistor and to form a well in the second transistor region.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention is described herein using a native NMOS transistor as an example. It should be understood, however, that the present invention is not so limited and may be employed in other applications requiring adjustment of transistor threshold voltage.

Figure 1A:
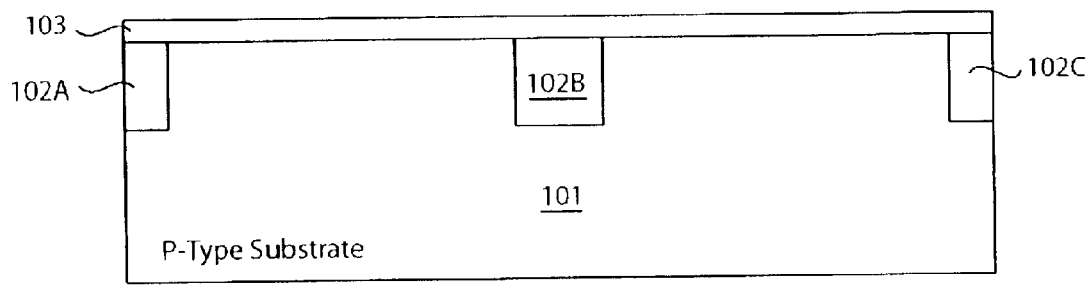
FIGS. 1(a)–1(c) show cross-sectional views schematically illustrating the fabrication of an integrated circuit in accordance with an embodiment of the present invention.
Figure 1B:
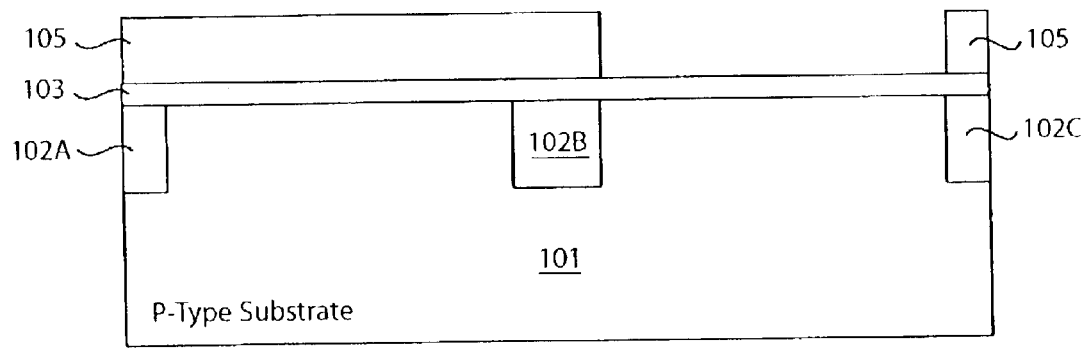
Figure 1C:
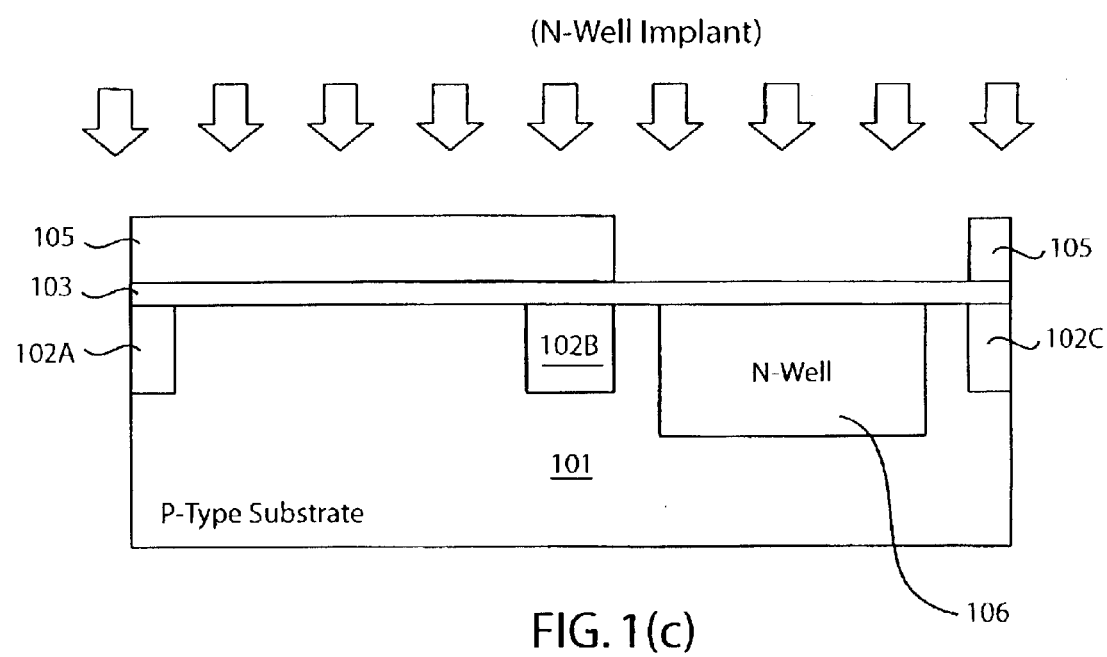

FIGS. 1(a)–1(c) show cross-sectional views schematically illustrating the fabrication of an integrated circuit in accordance with an embodiment of the present invention. In FIG. 1(a), isolation structures 102 (i.e., 102A, 102B, 102C) are formed in a substrate 101, which is a P-type substrate in this example. Each isolation structure 102 may be a shallow trench isolation structure (STI) filled with a barrier material, such as silicon dioxide. The region of substrate 101 between isolation structures 102A and 102B is referred to as an "NMOS transistor region" because an NMOS transistor is to be fabricated in that region. Similarly, the region of substrate 101 between isolation structures 102B and 102C is referred to as a "PMOS transistor region" because that is the region where a PMOS transistor is to be fabricated.

Still referring to FIG. 1(a), a screen oxide layer 103 is formed over substrate 101. Screen oxide layer 103 allows subsequent implants to diffuse for better uniformity, and also helps seal implanted dopants in substrate 101 during an anneal step. Screen oxide layer 103 may be thermally grown to a thickness of about 100 to 150 Angstroms.

In FIG. 1(b), an implant mask 105 is formed over substrate 101. Implant mask 105 covers the NMOS transistor region, while leaving the PMOS transistor region exposed. Implant mask 105 serves as a mask for the subsequently performed N-well implant step (see FIG. 1(c)). In contrast to conventional techniques where an implant mask is made relatively thick (e.g., thicker than about 2 microns) to substantially block dopants from being implanted into an NMOS transistor region during an N-well implant step, implant mask 105 is formed to a thickness that will allow dopants to be implanted in the NMOS transistor region. That is, implant mask 105 may be formed such that N-type dopants may be implanted in the NMOS transistor region during formation of an N-well in the PMOS transistor region. In one embodiment, implant mask 105 comprises photoresist material formed to a thickness of about 1.13 microns using conventional lithography techniques.

In FIG. 1(c), an N-well implant is performed to form an N-well 106 in the PMOS transistor region. The N-well implant implants an N-type dopant, such as phosphorous. The same N-well implant also implants an N-type dopant in the NMOS transistor region. Because of implant mask 105, the amount of dopant implanted in the NMOS transistor region is not enough to form a well. However, depending on the thickness of implant mask 105, that amount may be sufficient to appreciably adjust the threshold voltage of an NMOS transistor. Note that as used in the present disclosure, the phrase "appreciably adjust" means adjusting the magnitude of the threshold voltage of a MOSFET by at least about 10 millivolts.

By varying the thickness of implant mask 105, the amount of dopant implanted into the NMOS transistor region may be controlled to obtain a particular threshold voltage. For example, the dosage of the N-well implant may be set to obtain a particular N-well profile, and the thickness of implant mask 105 may be set to obtain a particular threshold voltage with that dosage. In one embodiment, a phosphorous N-well implant has a dosage of about $2.24 \times 10^{13}/cm^2$ and an energy of about 270 keV (kilo-electron Volts) to form an N-well 106 that is about 1 micron deep. In that embodiment, an implant mask 105 comprising photoresist material that is about 1.13 microns thick results in an NMOS transistor with a threshold voltage of about −49.1 millivolts. Still in that embodiment, an implant mask 105 comprising photoresist material that is about 2.1 microns thick results in an NMOS transistor with a threshold voltage of about −2.7 millivolts. Thus, changing the thickness of implant mask 105 from 2.1 microns to 1.13 microns may result in the magnitude of the threshold voltage being lowered by about 46.3 millivolts.

As can be appreciated from the foregoing, embodiments of the present invention advantageously allow for adjustment of threshold voltage during a well implant step. This obviates the need for a separate compensate implant step, which increases the cost of manufacturing the integrated circuit. Embodiments of the present invention may be employed to fabricate transistors with low threshold voltage, and that are suitable for use in various applications, such as regulators and I/O circuits, for example.

Figure 2:
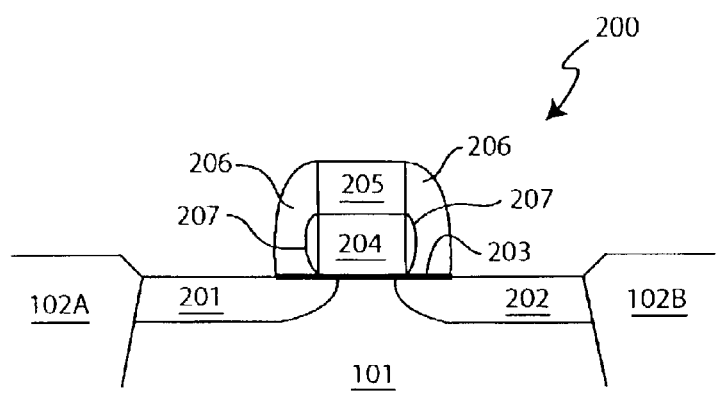
FIG. 2 shows an example transistor formed in a transistor region that is in accordance with an embodiment of the present invention.

After the N-well implant step, conventional semiconductor processing techniques may be employed to complete the integrated circuit. FIG. 2 shows an example where an NMOS transistor 200 is formed in the NMOS transistor region between isolation structures 102A and 102B. In the example of FIG. 2, a source 201 and a drain 202 are formed in substrate 101. Between source 201 and drain 202 is a gate stack comprising a gate oxide layer 203, a polysilicon gate 204, spacers 206 of silicon nitride, and a capping layer 205 of silicon nitride. Oxide layer 207 may be formed on the sidewalls of polysilicon gate 204 to help protect gate oxide layer 203 at the foot of the gate stack.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of adjusting a threshold voltage of a transistor, the method comprising:

forming a mask over a first transistor region; and implanting a dopant through the mask to appreciably adjust a threshold voltage of a first transistor being fabricated in the first transistor region, wherein implanting the dopant through the mask results in formation of a well in a second transistor region.

2. The method of claim 1 wherein the first transistor region is an NMOS transistor region, the second transistor region is a PMOS transistor region, and the well is an N-well in the PMOS transistor region.

3. The method of claim 1 wherein the mask is formed over a screen oxide layer.

4. The method of claim 3 wherein implanting the dopant through the mask lowers the threshold voltage of the first transistor.

5. The method of claim 1 wherein the mask comprises a photoresist material.

6. The method of claim 1 wherein the mask comprises a photoresist material.

7. The method of claim 6 wherein the mask is formed to a thickness of about 1.13 microns.

8. The method of claim 1 wherein a magnitude of the threshold voltage is adjusted by at least about 10 millivolts.

9. A method of adjusting a threshold voltage of a native NMOS transistor, the method comprising:

implanting an N-type dopant in an NMOS transistor region during formation of an N-well in a PMOS transistor region to appreciably adjust a threshold voltage of an NMOS transistor being fabricated in the NMOS transistor region.

10. The method of claim 9 wherein the N-type dopant is implanted in the NMOS transistor region through a mask.

11. The method of claim 10 wherein the mask comprises photoresist material.

12. The method of claim 10 wherein the mask comprises photoresist material formed to a thickness of about 1.13 microns.

13. The method of claim 9 wherein the N-type dopant is implanted in the NMOS transistor region through a mask and a layer of screen oxide.

14. The method of claim 9 wherein implanting the N-type dopant in the NMOS transistor region lowers the threshold voltage of the NMOS transistor.

15. The method of claim 9 wherein a magnitude of the threshold voltage of the NMOS transistor is adjusted by at least about 10 millivolts.

* * * * *